United States Patent [19]
Feigenbaum et al.

[11] Patent Number: 5,708,557
[45] Date of Patent: Jan. 13, 1998

[54] PUNCTURE-RESISTANT ELECTROSTATIC CHUCK WITH FLAT SURFACE AND METHOD OF MAKING THE SAME

[75] Inventors: Haim Feigenbaum, Irvine; Bao Le, Santa Ana; Randy Lee Thomas, Orange; Dong Vo, Garden Grove, all of Calif.

[73] Assignee: Packard Hughes Interconnect Company, Irvine, Calif.

[21] Appl. No.: 703,921

[22] Filed: Aug. 22, 1996

[51] Int. Cl.[6] .................................................. H02N 13/00
[52] U.S. Cl. ........................................... 361/234; 279/128
[58] Field of Search .............................. 361/234; 279/128

[56] References Cited

U.S. PATENT DOCUMENTS

| | | | |
|---|---|---|---|
| 5,284,549 | 2/1994 | Barnes et al. | 156/531 |
| 5,315,473 | 5/1994 | Collins et al. | 361/234 |
| 5,345,999 | 9/1994 | Hosokawa | 165/80.2 |
| 5,348,497 | 9/1994 | Nitescu | 439/824 |
| 5,350,479 | 9/1994 | Collins et al. | 156/345 |
| 5,459,632 | 10/1995 | Birang et al. | 361/234 |
| 5,486,975 | 1/1996 | Shamouilian et al. | 361/234 |
| 5,491,603 | 2/1996 | Birang et al. | 361/234 |

*Primary Examiner*—Jeffrey A. Griffin
*Assistant Examiner*—Thuy-Trang N. Huynh
*Attorney, Agent, or Firm*—Cary W. Brooks

[57] ABSTRACT

The invention includes a puncture-resistant electrostatic chuck with a flat surface and a method of making the same. The electrostatic chuck includes a conductive layer such as copper foil that is laminated to a first insulation layer such as a polyimide. A puncture-resistant layer is placed over the conductive layer and includes random or woven fibers held together by a resin. The puncture-resistant layer has an uneven topography on a top surface due to the fibers contained therein. A second insulation layer overlies the puncture-resistant layer and has a top surface which is substantially flat. The flat top surface of the second insulation layer is made by laminating layers together with a mandrel which is polished and free of irregularities such as pits, dents and high spots. Preferably the mandrel has a uniform thickness over its entire surface.

9 Claims, 2 Drawing Sheets

PUNCTURE-RESISTANT ELECTROSTATIC CHUCK WITH FLAT SURFACE AND METHOD OF MAKING THE SAME

FIELD OF THE INVENTION

This invention relates to an electrostatic chuck having a puncture-resistant layer.

BACKGROUND OF THE INVENTION

An electrostatic chuck holds a semiconductor wafer onto a pedestal using electrostatic attraction inside a plasma reactor chamber. In semiconductor manufacturing operations occasionally the wafers break during processing and small, sharp chards or broken fragments of silicon become dislodged from the wafer. These silicon particles can penetrate through the dielectric surface of some electrostatic chuck assemblies, causing shorting. Therefore, it is desirable to use a puncture-resistant layer overlying the conductive layer of the electrostatic chuck. This puncture-resistant layer may include random or woven fibers impregnated in a resin. However, the fibers result in an uneven topography of the electrostatic chuck surface, making it extremely difficult for the wafer to be held flatly against the chuck.

The present invention provides alternatives and advantages over the prior art.

SUMMARY OF THE INVENTION

The invention includes a puncture resistant electrostatic chuck with a flat surface and a method of making the same. The electrostatic chuck includes a conductive layer such as copper foil that is laminated to a first insulation layer such as a polyimide. A puncture-resistant layer is placed over the conductive layer and includes random or woven fibers held together by a resin. The puncture-resistant layer has an uneven topography on the top surface due to the fibers contained therein. A second insulation layer overlies the puncture-resistant layer and has a top surface which is substantially flat. The flat top surface of the second insulation layer is made by laminating layers together with a mandrel which is polished and free of irregularities such as pits, dents and high spots. Preferably the mandrel has a uniform thickness over its entire surface.

These and other objects, features and advantages of the present invention will become apparent from the following brief description of the drawings, detailed description and appended claims and drawings.

DETAILED DESCRIPTION

Figure 1:
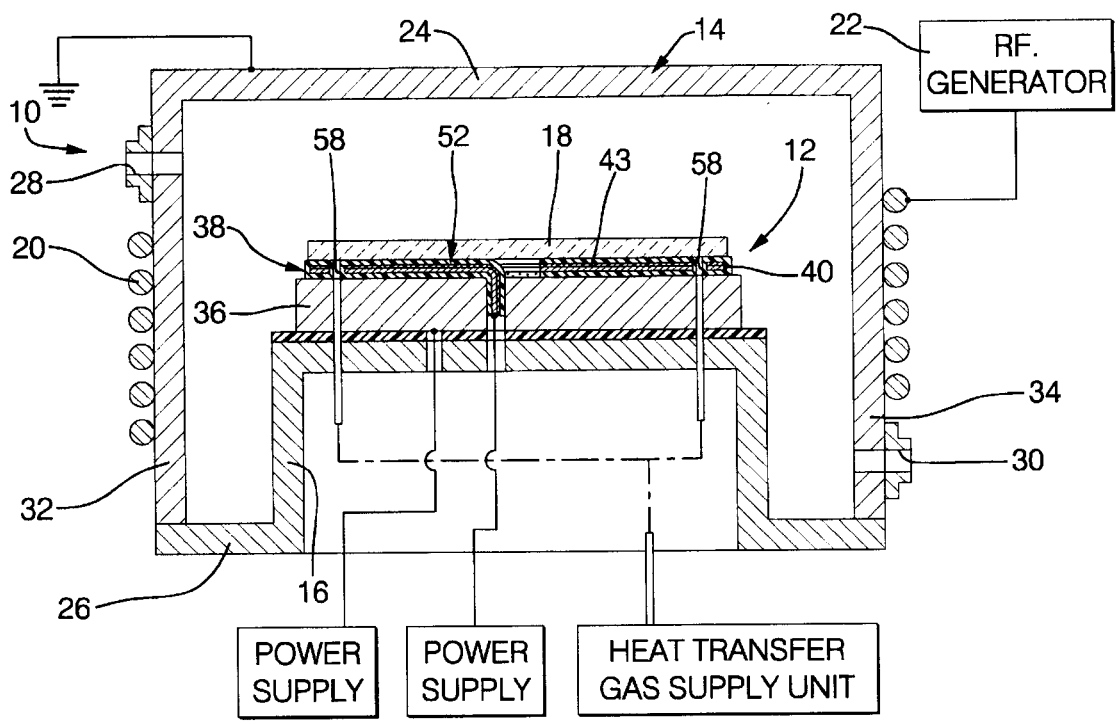
FIG. 1 is a partial sectional view of a plasma etching apparatus including electrostatic chuck according to the present invention.
Figure 3:
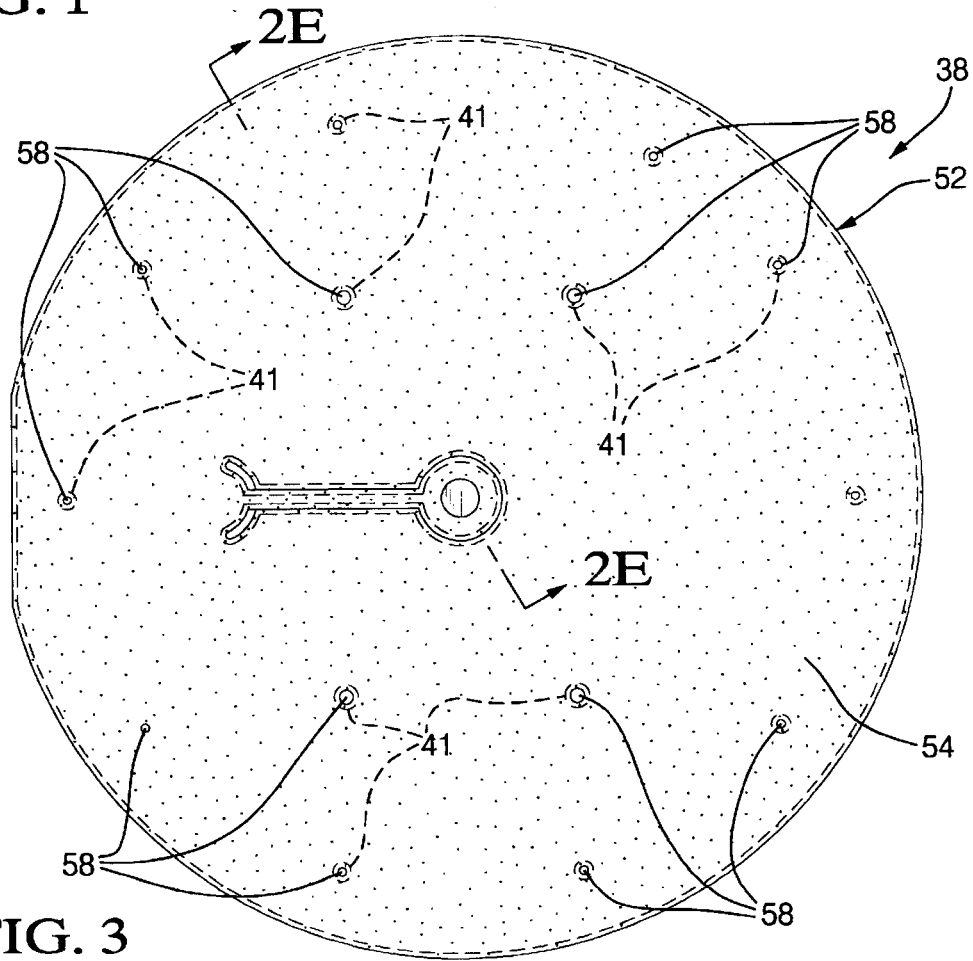
FIG. 3 is a top view of the electrostatic chuck according to the present invention.
Figure 2A:
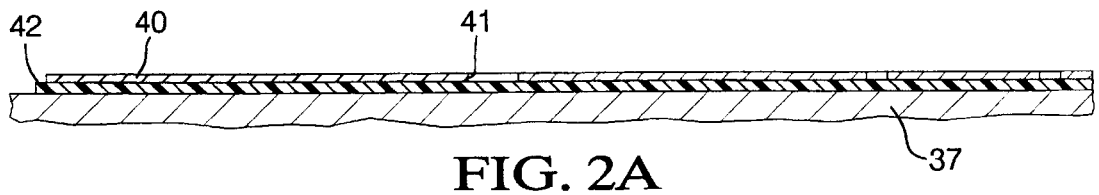
FIGS. 2A–2F are sectional views illustrating a method of making an electrostatic chuck according to the present invention.
Figure 2B:
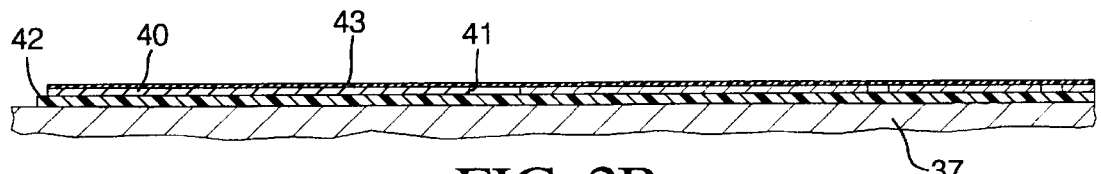
Figure 2C:
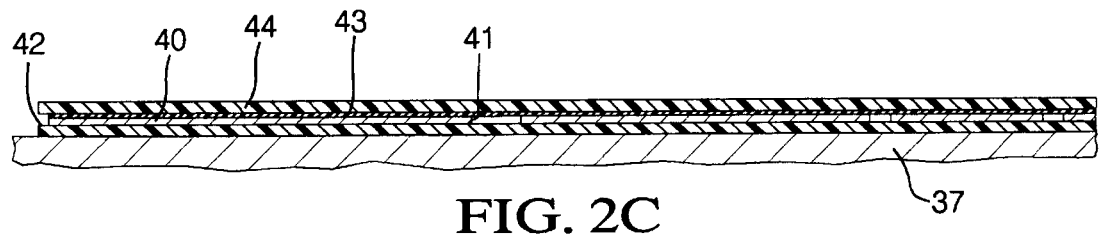
Figure 2D:
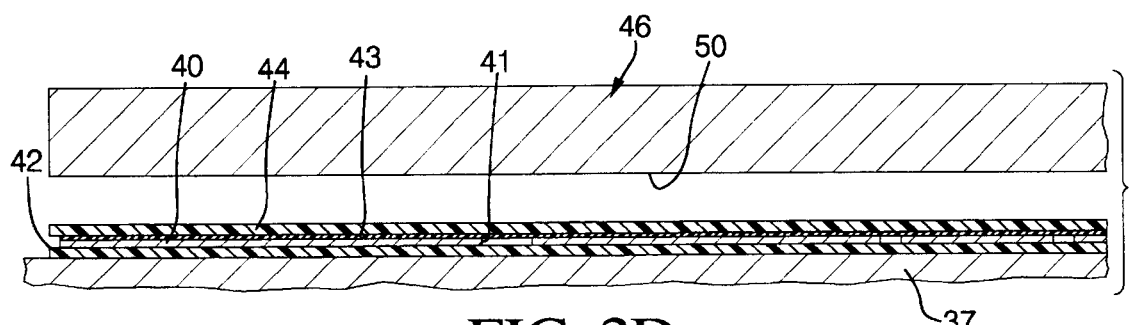
Figure 2E:
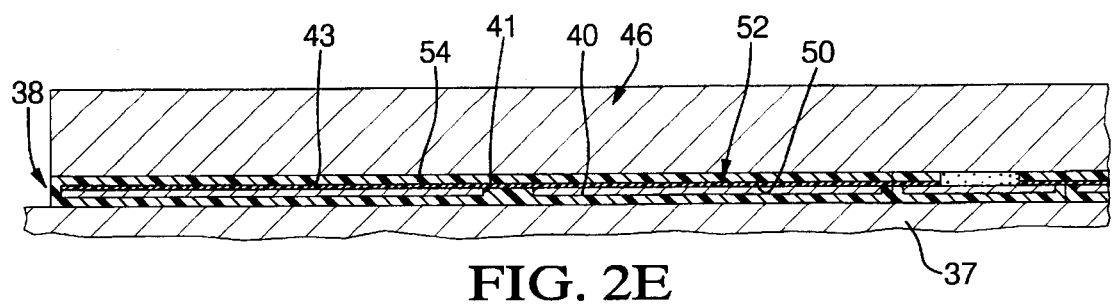
Figure 2F:
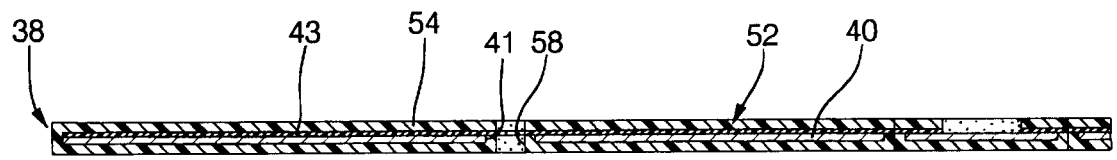

Plasma etching apparatus are known to those skilled in the art. FIG. 1 schematically illustrates such a plasma etching apparatus 10 equipped with an electrostatic chuck 12 of the present invention. The apparatus includes a vacuum chamber 14, a pedestal 16 arranged in the chamber for supporting a silicon semiconductive wafer 18, RF coil 20 and a RF generator source 22 for generating a plasma. The vacuum chamber 14 includes an upper wall 24 and a lower wall structure 26, a gas inlet port 28 and a gas outlet port 30 located on opposed walls 32, 34 respectively and connecting to a vacuum chamber pump (not shown) to reduce the pressure in the chamber. An electrostatic chuck 12 is placed on the pedestal 16 for holding a wafer 18. The electrostatic chuck 12 includes a main body 36 serving as a lower electrode and connected to a power source. The upper wall 24 of the chamber serves as an upper electrode and is tied to ground. Thus, the electrodes are aligned to form plane parallel electrodes. An upper portion 38 of the electrostatic chuck includes a conductor such as a copper film covered top and bottom by an insulating film such as polyimide. The upper portion 38 of the electrostatic chuck is also connected to a power supply for electrostatically holding the wafer 18 onto the electrostatic chuck. A heat transfer gas supply port is provided through both the main body portion and the upper portion of the electrostatic chuck. Heat transfer gas such as oxygen, nitrogen or an inert gas such as helium or argon is supplied to cool the underside of the semiconductor wafer.

An electrostatic chuck may be constructed as follows. A conductive layer 40 such as a copper foil having a thickness of about 1 micron to 0.0014 inches is provided. The copper foil 40 is laminated to a first insulative layer 42 such as polyimide which is placed on a substrate 37. The first insulative layer 42 is later secured to the main body portion 36 of the electrostatic chuck which may be an aluminum substrate approximately 1.0 inches thick.

A puncture-resistant layer 43 is placed over at least a portion of the copper foil 40. The puncture-resistant layer 43 includes fiber randomly placed or woven and impregnated within a resin. The fibers may be of any type sufficient to prevent silicon or other particulates from penetrating the puncture-resistant layer 43. The fibers may be polycarbonate type, or preferably Kevlar® aramid fiber available from DuPont company in an epoxy or polyimide adhesive. A puncture-resistant layer may be made from non-woven fiber available from Arlon company under the trade name Thermount55NT. Preferably, the puncture-resistant layer has a thickness of about 0.001 to 0.002 inches. The amount of fibers in the resin may vary, but preferably ranges from about 10 to about 25 weight percent of the puncture-resistant layer. The top surface 45 of the puncture-resistant layer is irregular having pits, dents and high spots associated with the random or woven fibers.

A second insulative layer 44 which may be polyimide is placed over the puncture-resistant layer 43. Preferably, each insulative layer 42, 44 has a thickness of about 0.0005 to 0.002 inches.

A mandrel 46 is provided having a polished surface 50 and free of irregularities such as pits, dents or high spots. Preferably the mandrel has a uniform thickness over its entire surface generally within plus or minus 0.001 inches. The first and second insulative layers 42, 44, and the conductive and puncture-resistant layers 43 are laminated together by forcing the mandrel 46 against the second insulative layer 44 at a pressure of about 275 psi, for a period of about 90 minutes at a temperature of about 380° F. The mandrel is removed to product the conductive and puncture-resistant layers encapsulated by an insulator 52 having a top surface 54 which is smooth, free of irregularities such as pits, dents or high spots and has a glass-like flat surface. The element 52 may be designed with cut-out holes 58 to allow cooling gases to flow under the wafer 18. Raised features may be formed in the top surface 54 by cutting grooves in the mandrel surface 50 as disclosed in assignee's U.S. copending application Ser. No. 08/673,856 by Thomas, entitled "Creating Surface Topography on an Electrostatic Chuck with a Mandrel" the disclosure of which is hereby incorporated by reference. The element 52 is then secured to the body portion 36 of the electrostatic chuck.

What is claimed is:

1. An electrostatic chuck for plasma etching apparatus comprising a conductive layer, a puncture-resistant layer comprising a plurality of fibers impregnated within a resin wherein a top surface of the puncture-resistant layer has an irregular rough topography including high spots and depressions associated with the plurality of fibers, said conductive layer and puncture-resistant layer being encapsulated in an insulative layer, the insulative layer having an upper surface of which a substantial portion is flat, planar and substantially free of irregularities.

2. An electrostatic chuck as set forth in claim 1 wherein a bottom surface of the insulative layer is secured to an electrode.

3. A method of making an electrostatic chuck providing a conductive layer, placing a puncture-resistant layer at least over a portion of the conductive layer wherein the puncture-resistant layer comprises a plurality of fibers impregnated in the resin and wherein the puncture-resistant layer includes a top surface having a rough irregular topography including high portions and depressions associated with the plurality of fibers, placing an insulative layer over the puncture-resistant layer and forcing a mandrel having a polished surface free of irregularities against the insulative layer under sufficient temperature and pressure to produce a top surface in the insulative layer which is smooth and free of irregularities such as pits, dents and high spots.

4. A method as set forth in claim 3 wherein said insulative layer comprises a polyimide material.

5. A method as set forth in claim 3 wherein said conductive layer comprises a copper foil.

6. A method as set forth in claim 3 wherein said fibers comprise a polycarbonate material.

7. A method as set forth in claim 3 wherein said resin comprises a polyimide.

8. A method as set forth in claim 3 wherein said fibers comprise about 10 to about 25 weight percent of said puncture-resistant layer.

9. A method as set forth in claim 3 wherein said conductive layer comprises a copper foil having a thickness ranging from about ¼ micron to about 0.0014 inches.

\* \* \* \* \*

Disclaimer 5,708,557—Haim Feigenbaum, Irvine; Bao Le, Santa Ana; Randy Lee Thomas, Orange; Dong Vo, Garden Gove, all of Calif. PUNCTURE-RESISTANT ELECTROSTATIC CHUCK WITH FLAT SURFACE AND METHOD OF MAKING THE SAME. Patent dated Jan. 13, 1998. Disclaimer filed July 14, 1998, by the assignee, Packard Hughes Interconnect Company.

Hereby enters this disclaimer to claims 1-2 of said patent.

*(Official Gazette,* October 20, 1998)